(12) United States Patent
Akerib et al.

(10) Patent No.: US 9,406,381 B2
(45) Date of Patent: Aug. 2, 2016

(54) TCAM SEARCH UNIT INCLUDING A DISTRIBUTOR TCAM AND DRAM AND A METHOD FOR DIVIDING A DATABASE OF TCAM RULES

(75) Inventors: Avidan Akerib, Tel Aviv (IL); Oren Agam, Zichron Yaakov (IL); Eli Ehrman, Beit Shemesh (IL)

(73) Assignee: GSI TECHNOLOGY ISRAEL LTD., Tel Aviv (IL)

( * ) Notice: Subject to any disclaimer, the term of this patent is extended or adjusted under 35 U.S.C. 154(b) by 317 days.

(21) Appl. No.: 13/137,245

(22) Filed: Aug. 1, 2011

(65) Prior Publication Data

US 2012/0137060 A1    May 31, 2012

Related U.S. Application Data

(60) Provisional application No. 61/369,712, filed on Aug. 1, 2010, provisional application No. 61/375,884, filed on Aug. 23, 2010.

(51) Int. Cl.
*G11C 15/04* (2006.01)
*G11C 15/00* (2006.01)
*H04L 12/741* (2013.01)
*G06F 17/30* (2006.01)
*H04L 12/743* (2013.01)

(52) U.S. Cl.
CPC ............... *G11C 15/00* (2013.01); *G11C 15/04* (2013.01); *H04L 45/7457* (2013.01); *G06F 17/30982* (2013.01)

(58) Field of Classification Search
CPC .. G11C 15/00; G11C 15/04; G06F 17/30982; H04L 45/7457

USPC ........................................................ 711/108
See application file for complete search history.

(56) References Cited

U.S. PATENT DOCUMENTS

| 6,731,526 | B2 * | 5/2004 | Inoue ........................ 365/49.17 |
| 7,426,518 | B2 * | 9/2008 | Venkatachary et al. |
| 7,467,129 | B1 * | 12/2008 | Bong |
| 2009/0234841 | A1 * | 9/2009 | Watanabe ........................ 707/5 |
| 2011/0307656 | A1 * | 12/2011 | Hamdi et al. ................. 711/108 |

FOREIGN PATENT DOCUMENTS

WO    WO 2011048522 A2 *    4/2011

* cited by examiner

*Primary Examiner* — Tuan Thai
*Assistant Examiner* — Glenn Gossage
(74) *Attorney, Agent, or Firm* — Eitan, Mehulal & Sadot (57) ABSTRACT

A search unit including a distributor TCAM and a DRAM search unit and a method to divide a database of TCAM rules is disclosed. The method includes selecting a rule having multiple "don't care" values and selecting a bit of the rule having a "don't care" value, generating two distributor rules based on the selected rule, associating rules of the database which match each of the distributor rules with the distributor rule they match to create subset databases, and repeating the steps of selecting, generating and associating until the average number of rules in each subset database is at or below a predefined amount. A DRAM storage unit has a section for each subset database, where each section is pointed to by a different distributor rule. A DRAM search unit matches an input key to one of the rules in the section pointed to by the matched distributor rule.

8 Claims, 8 Drawing Sheets

TCAM SEARCH UNIT INCLUDING A DISTRIBUTOR TCAM AND DRAM AND A METHOD FOR DIVIDING A DATABASE OF TCAM RULES

CROSS-REFERENCE TO RELATED APPLICATIONS

This application claims benefit from U.S. Provisional Patent Applications No. 61/369,712, filed Aug. 1, 2010 and 61/375,884, filed Aug. 23, 2010, which are hereby incorporated in their entirety by reference.

Appendix A, in the file "U.S. Ser. No. 13/137,245-Appendix_A.txt", created May 18, 2016, having a size of 3 KB, and Appendix B, in the file "U.S. Ser. No. 13/137,245-Appendix_B.txt", created May 18, 2016, having a size of 23 KB, are incorporated herein by reference.

FIELD OF THE INVENTION

The present invention relates to TCAMs (ternary content addressable memory) generally.

BACKGROUND OF THE INVENTION

TCAMs (ternary content addressable memory) are known in the art. They are units which store data of three states, 0, 1 or X (don't care) and are generally used to store data which needs to be searched, such as addresses of nodes in a network or phone numbers. TCAMs are used for parallel searching of an input "key" or part of a key within large databases. For example, if the key is 101 and the stored data are 1XX, 101, XXX, 010, 001, 100, the first three values will be matched while the next three values will not be matched.

Because the data has three possible states, a range of values may be represented by one key using the X state. Thus, 1XX represents the keys 111, 110, 101 and 100.

Figure 1:
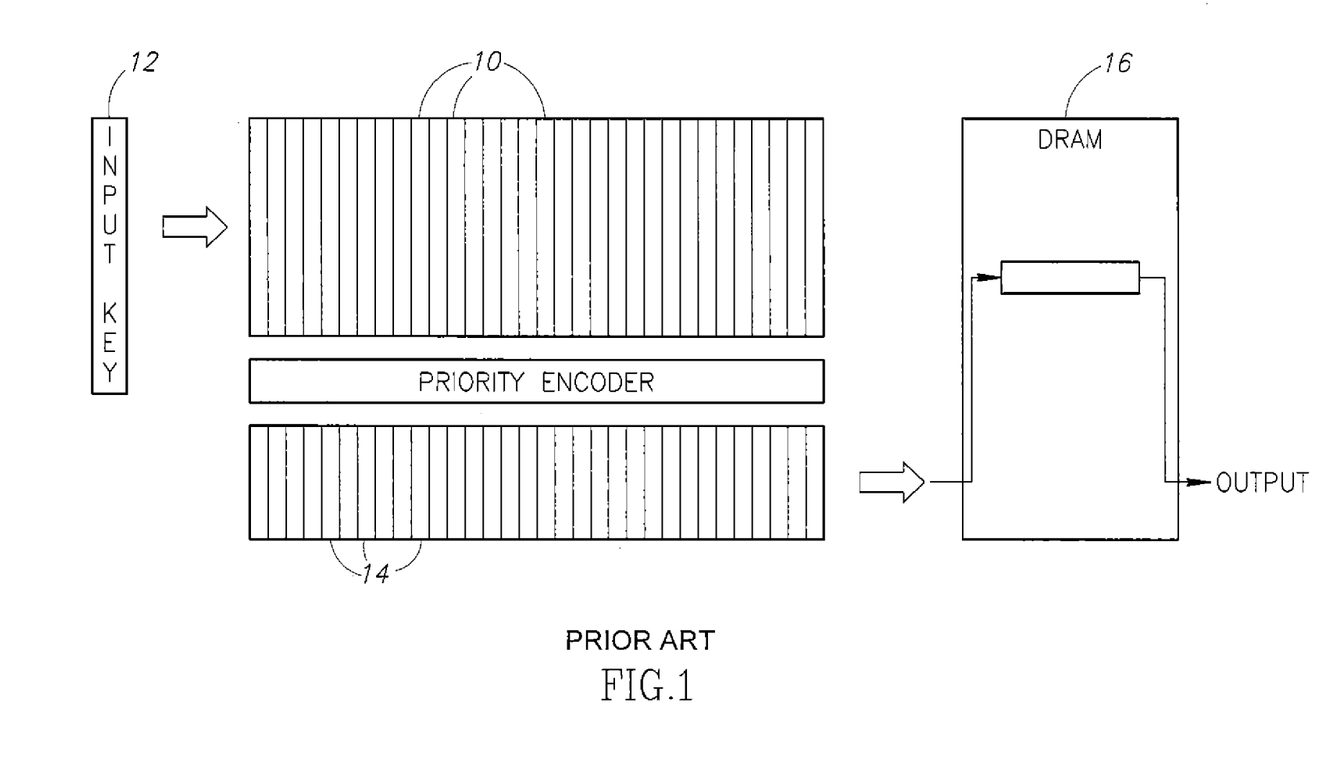
FIG. 1 is a schematic illustration of a prior art TCAM search unit.

An exemplary TCAM unit is shown in FIG. 1, to which reference is now made. The data is stored in plurality of columns 10, where each column stores one key and each key is associated with a pointer to a further memory which stores other information related to the key. Thus, if the key is a network address, such as is the case for an access control list (ACL) search, the pointer may point to the output port for that network address. The pointer may also point to information about how to process the address, such as to ignore it or to pass it on.

Each individual TCAM unit has its own comparison circuit to detect a match between the stored bit (1, 0, or X (Don't Care)) and the input bit (1 or 0). The individual TCAM units are connected together in rows by word lines and in columns by bit lines. When an input key 12 (i.e. a port number or IP source or destination address) is received for searching in the TCAM, the values of the elements of the key are separately provided to the rows, to be simultaneously matched by each TCAM unit of the row. Thus, the first bit of the key is provided to the first row, the second bit to the second row, etc. The output of the TCAM is read by the columns. A match occurs when all of the TCAM units in a column are matched to the bits of the input key.

Each column is associated with a pointer 14, pointing to a section of a DRAM (dynamic random access memory) 16 in which information about the key is stored. For example, if the key refers to an address within a network, the information in DRAM 16 may be out of which port of the switch, where the TCAM may be located, to transmit the packet having the input address.

The problem with TCAM units is that each TCAM unit requires both a memory element and a comparison circuit. Thus, TCAM units are relatively large (compared to simple memory units which don't have the comparison circuits) and thus are not built to store very large amounts of data to be matched.

SUMMARY OF THE PRESENT INVENTION

There is therefore provided, in accordance with a preferred embodiment of the present invention, a search unit including a distributor TCAM (ternary content addressable memory) and a DRAM (dynamic random access memory) search unit having a DRAM storage unit and an associated DRAM search logic unit. The distributor TCAM stores distributor rules having multiple bits with don't care values and matches an input key to one of the distributor rules. The DRAM storage unit has a large plurality of sections, each section pointed to by a different distributor rule and storing a small plurality of rules defined by its associated distributor rule. The DRAM search unit matches the input key to one of the rules in the section pointed to by the one of the distributor rules.

Additionally, in accordance with a preferred embodiment of the present invention, the DRAM search logic unit is implemented within the DRAM unit.

Moreover, in accordance with a preferred embodiment of the present invention, the DRAM storage unit includes a multiplicity of banks and the DRAM search logic unit may access one row from each bank of the DRAM storage unit generally at the same time.

Further, in accordance with a preferred embodiment of the present invention, the TCAM search unit also includes a global parents TCAM to store distributor rules each having a significant plurality of children rules.

There is also provided, in accordance with a preferred embodiment of the present invention, a method implementable in software to divide a database of TCAM rules. The method includes selecting a rule of the database having multiple don't care values and selecting a bit of the rule having a don't care value, generating two distributor rules based on the selected rule, where the selected bit has a 1 value in one of the distributor rules and a 0 in the other of the distributor rules, associating rules of the database which match each of the distributor rules with the distributor rule they match thereby to create associated databases, and repeating the steps of selecting, generating and associating on the database and the associated databases until the average number of rules in each of the associated databases is less than or equal to a predefined amount.

Additionally, in accordance with a preferred embodiment of the present invention, the method also includes placing the distributor rules into a TCAM and placing the associated databases in a DRAM.

Further, in accordance with a preferred embodiment of the present invention, the method also includes placing the distributor rules into a TCAM and placing each of the associated databases in a small TCAM.

Still further, in accordance with a preferred embodiment of the present invention, the method also includes determining a set of global parents rules each having a significant plurality of children rules.

Finally, in accordance with a preferred embodiment of the present invention, the method also includes placing the set of global parents rules into a global parents TCAM, separate from a TCAM for the distributor rules and separate from a storage unit for the associated rules.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicants have realized that it is possible to reduce the size of the search through a TCAM (ternary content addressable memory) database by providing a multi-stage hierarchical search using both TCAMs and DRAMs (dynamic random access memory) in the search. The initial search may be a search through the TCAM which may point to a particular DRAM or section of a DRAM for the next stage. As Applicants have realized, when the database is divided into a large plurality of small databases, each of the small databases may be stored and easily searched in a DRAM.

Moreover, the data stored in the TCAM may be organized into overlapped groups or databases such that a search within one group is sufficient to have searched the entire TCAM. This may increase the speed of the search. The number of groups may be a few to a few thousands.

Figure 2A:
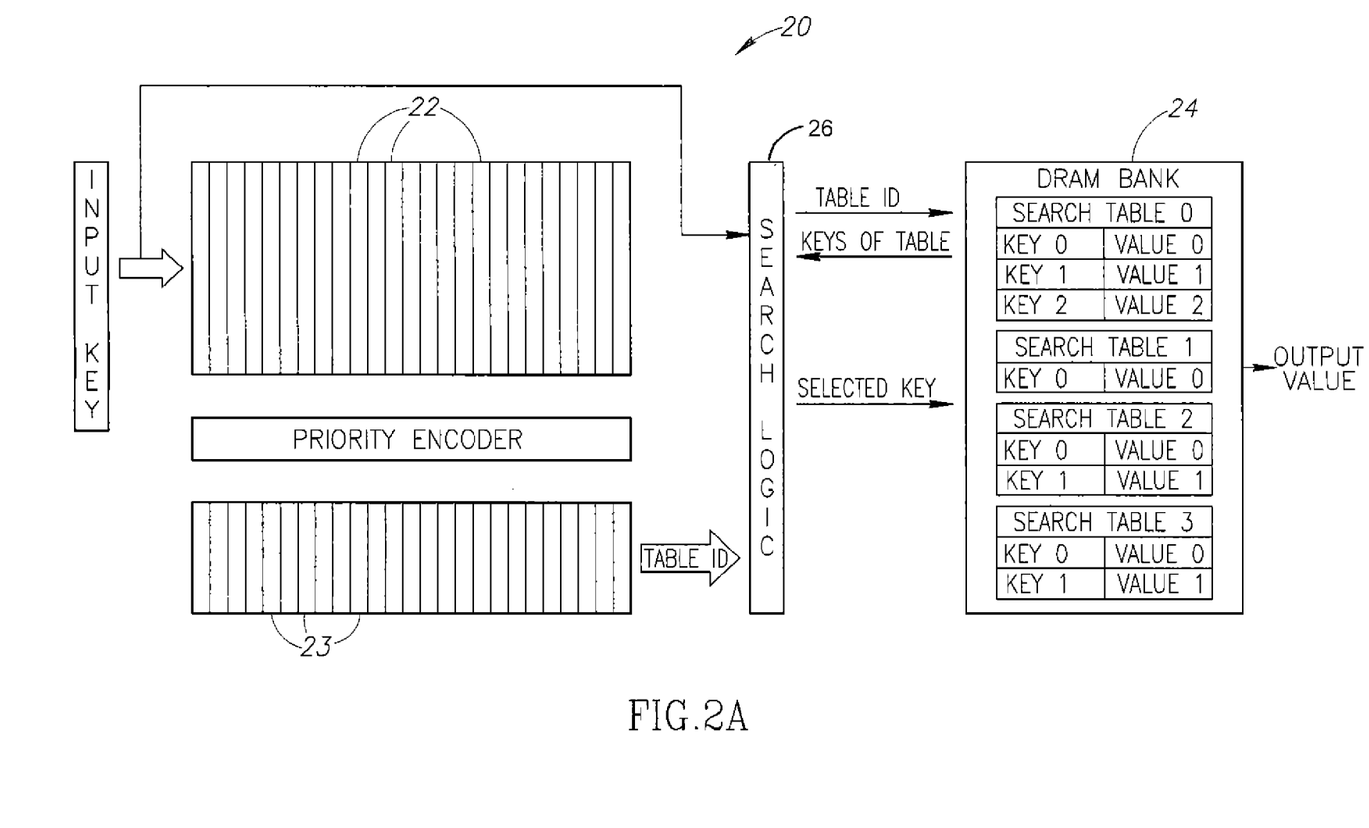
FIGS. 2A and 2B are schematic illustrations of two alternative embodiments of a multi-stage TCAM search unit, constructed and operative in accordance with the present invention.

Reference is now made to FIG. 2A, which illustrates a combined TCAM-DRAM search unit 20, constructed and operative in accordance with a preferred embodiment of the present invention. Search unit 20 may comprise a TCAM unit 22 having an associated table ID unit 23, a DRAM bank 24 of tables and search logic 26, generally located close to DRAM bank 24. DRAM bank 24 may be one of multiple DRAM banks 24 in a DRAM unit and search logic 26 may be embedded within the DRAM unit such that it may generally simultaneously access each of the multiple DRAM banks 24 of the DRAM unit, thereby performing multiple searches at generally the same time. This may provide for a relatively fast search through the data. Exemplary embedded computation units, for associative computing, are described in PCT Publication WO 2011/048522 A2, which is incorporated herein by reference. A similar technology may be utilized for embedding search unit 20 within a DRAM unit.

It will be appreciated that, if there are eight DRAM banks, then eight keys or "rules", stored in eight rows (one per bank), may be searched at generally the same time. Thus, if only a few (1-3) row accesses are desired, each table (or small database) stored in one DRAM section may be of 8-24 rules.

When an input key is presented to TCAM unit 22, a matched column may activate its associated column in table ID unit 23 which may point to a table in DRAM bank 24. Each table in DRAM bank 24 may have a set of associated rules, each of which is associated with an output value.

Search logic 26 may receive the table ID from TCAM 22 and may read the associated rows of DRAM 24, receiving back the rules associated with the table. This may take a few read cycles. At each read cycle, search logic 26 may search through the rules of the table, selecting the one which best matches the input key, if at all. Search logic 26 may be implemented in any suitable manner for performing searches. For example, it may implement a binary tree, a hash table, a TCAM pyramid, etc.

Search logic 26 may then provide the matched rule of the received table to DRAM 24 which may then output the value associated with the matched key along with any appropriate processing.

Figure 2B:
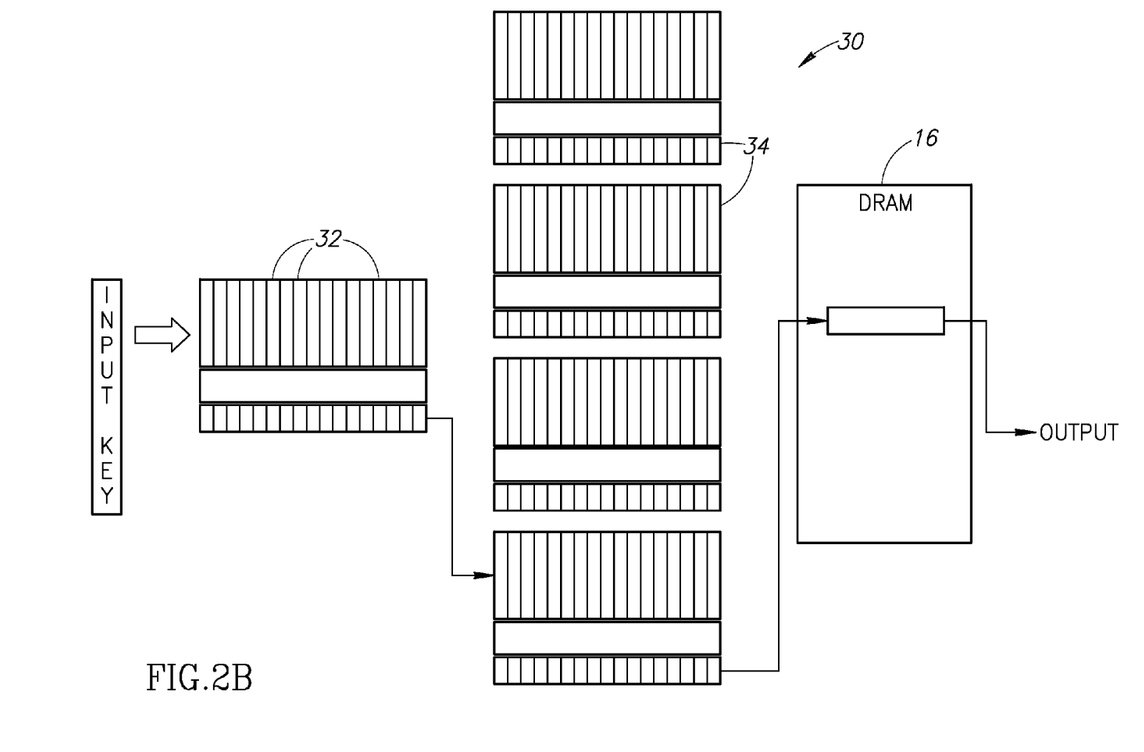

Alternatively, as shown in FIG. 2B, the search unit may be a hierarchical TCAM search unit 30 which may comprise a first stage TCAM 32, multiple second stage TCAMs 34 and an output DRAM, such as DRAM 16. In this embodiment, first stage TCAM 32 may be a small TCAM (of about less than 500 columns) which may receive the input key, and the output associated with each column may be a pointer to one of second stage TCAMs 34, where the activated column is that which matches the input key. The output of selected second stage TCAM 34, when matched against the input key, may be a pointer to the appropriate address in DRAM 16. If desired, the data in DRAM 16 may be organized to match the organization of second stage TCAMs 34.

Both embodiments divide the database to be searched into relatively small groups, thereby providing for fast searching in both stages, as well as reduced power consumption on the part of the TCAM units.

Moreover, the database is divided such that a search through one group and only one group is a sufficient search. The groups may overlap, but there is no need to search any other group once the search has been completed.

Figure 3A:
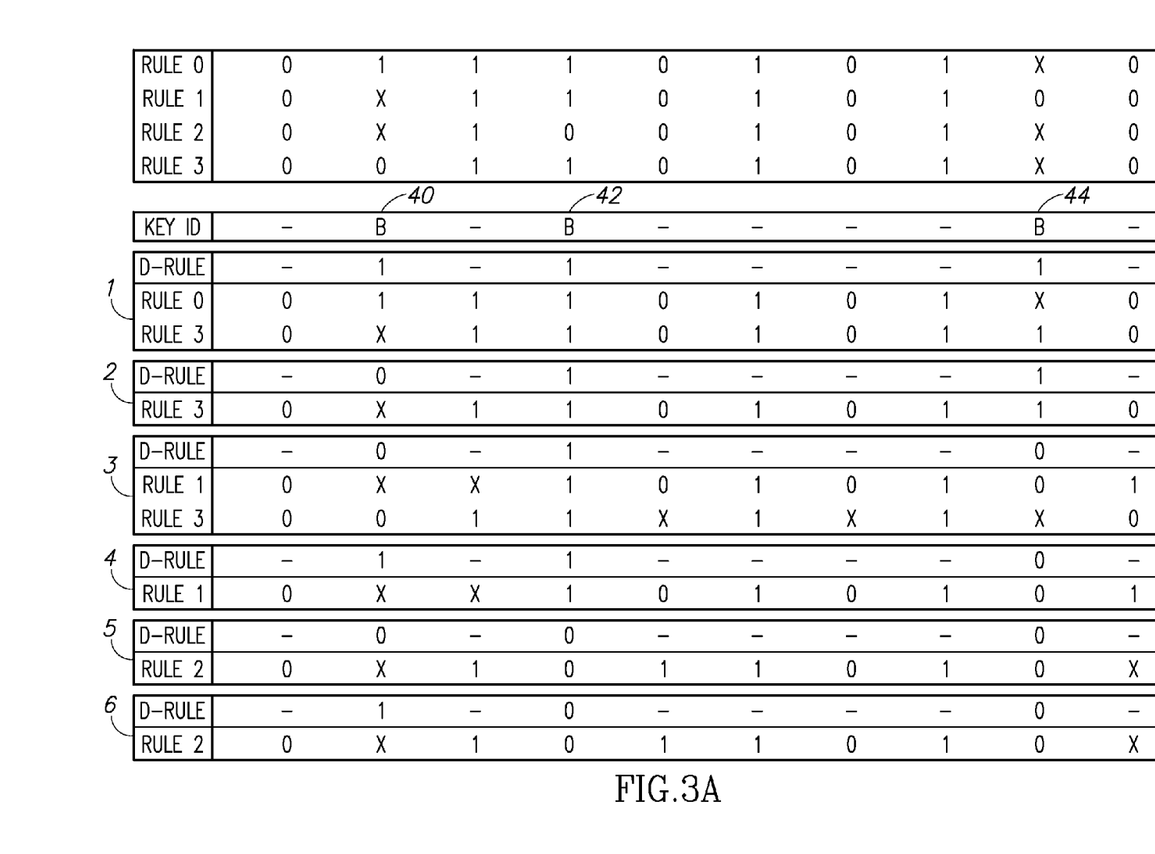
FIGS. 3A and 3B are schematic illustrations of two alternative methods of dividing a database of rules into distributor rules and their associated rules.
Figure 3B:
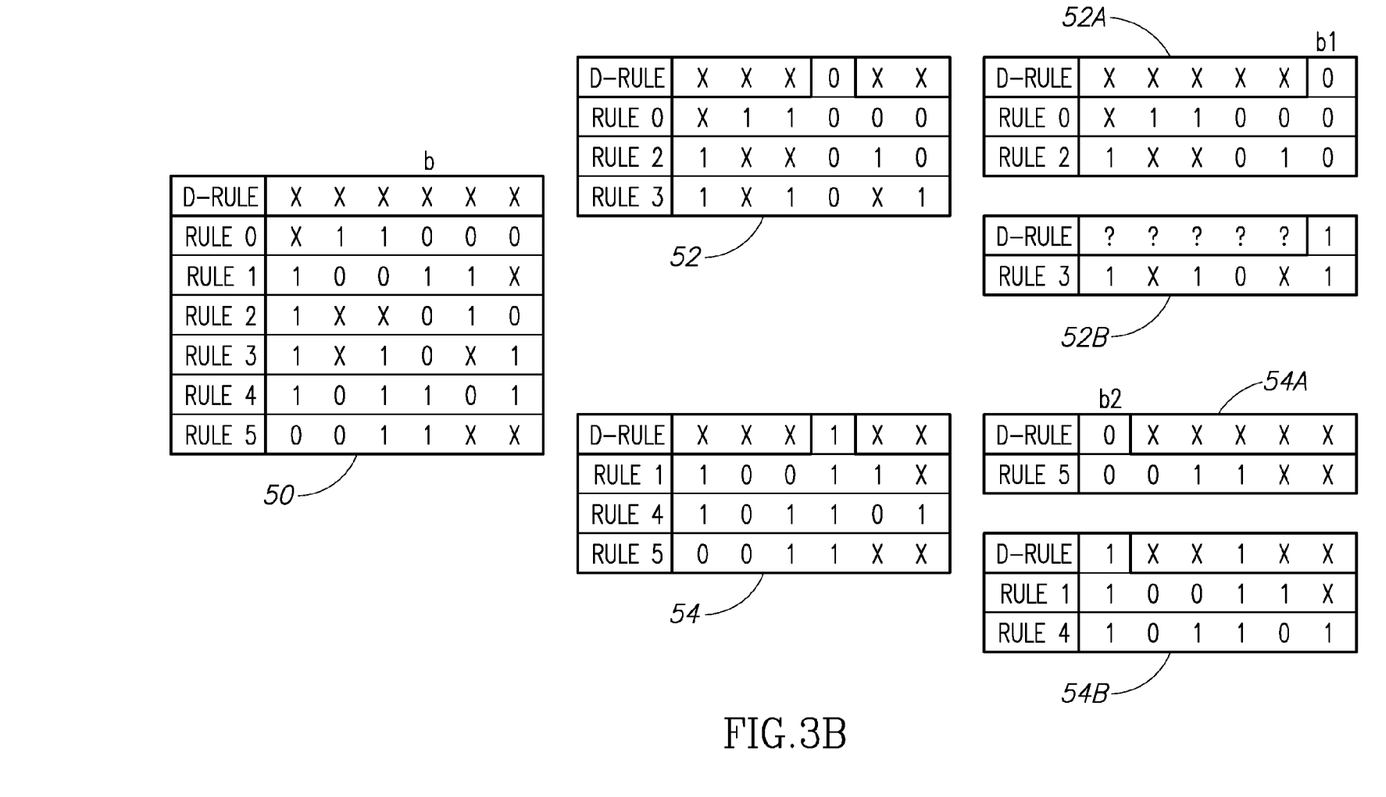

Reference is now made to FIGS. 3A and 3B which illustrate two ways to divide databases, a simple division in FIG. 3A and a more complicated division in FIG. 3B, both of which divide the database by reviewing the state of the bits in the rules and both of which may be implemented in software.

In general, the initial database may store a plurality of rules. For example, in FIG. 3A, the database may have four rules, each 10 bits long. Each bit may have three possible values (hence the term "ternary" CAM), 1, 0 or X, where X is a "don't care" value, meaning that the bit can be either 1 or 0.

Each rule may be divided into multiple "tuples", sets of 3 neighboring bits in a row. For each tuple, find the bit having the most ternary "don't care" (X) values, among the rules of the database, and use this bit, as a ternary match field, to divide the database. For example, in the database of FIG. 3A, bit 40, of the first tuple, has two ternary values and bit 44, of the final tuple, has three ternary values. Bit 42, of the middle tuple, has values of 1 and 0. The remaining bits are all 1s or all 0s. Thus, bits 40, 42 and 44 may be utilized to divide the database.

For each of the selected bits 40, 42 and 44, the values of the bit may be permuted and the result may be used as a distributor rule (D-rule). Thus, D-rule 1 may have bits 40, 42 and 44 with value 1, D-rule 2 may have bit 40 with value 0 while bits 42 and 44 have value 1, etc.

Each D-rule may define a smaller database, comprised of those rules which match the D-rule. FIG. 3A shows all of the D-rules and the rules which fall within them. Rules 0 and 3 fall within group 1, rule 3 falls within group 2, rules 1 and 3 fall within group 3, rule 1 falls within group 4, rule 2 falls within group 5 and rule 2 falls within group 6.

Note that the groups overlap, with some of the rules falling within multiple groups. This may ensure that a search based on one and only one D-rule may find all the rules that match the D-rule. This is a duplication of rules and, for large databases, such a duplication may significantly add to the size of the overall database. Thus, the simple division described hereinabove may be useful only for a small number (i.e. less than 4) divisions, in order to minimize the amount of overlap.

In an alternative embodiment, shown in FIG. 3B, the database 50 may be divided to avoid overlap. This may be appropriate for network address databases, such as ACL (access control list) searches, which may store 50 bit keys, with 25 bits for a source address and 25 bits for a destination address.

Initially, there may be a single D-rule with all the bits having the ternary value. A designer may select a bit b which may divide database 50 into two subset databases, where all the rules which have bit b as 0 go into a first subset database, such as subset database 52, with a D-rule with bit b as 0, and all the rules having bit b as 1 go into a second subset database, subset database 54, with a D-rule having bit b as 1. Bit b may be chosen to minimize duplication and to divide the database equally, as in FIG. 3B, though this is not always possible.

The process may be repeated as shown in FIG. 3B until all databases are below a required size or until there are too many D-rules to fit in a TCAM. In FIG. 3B, a second bit 'b1' may be the last bit and may divide database 52 into databases 52A and 52B, where database 52A may have the last bit as a 0 while database 52B may have it as a 1. Accordingly, rules 0 and 2 may fall into database 52A and rule 3 may fall into database 52B.

Databases 54A and 54B may differ in the first bit, as bit 'b2', where rule 5, with a 0 in the first bit, may fall into database 54A while rules 1 and 4, with the first bit as a 1, may fall into database 54B.

For the embodiments of FIGS. 3A and 3B, the final D-rules may be placed into a TCAM, such as TCAM 22 or 32, to define the first stage of the search. The rules themselves may be placed into a DRAM, such as DRAM 24, organized according to the D-rule with which they are associated, and [and with which they] may be searched by search logic 26. Alternatively, the rules may be placed into multiple second stage TCAMs 34.

It will be appreciated that the methods described hereinabove reduce the size of the TCAM searches and enable multiple TCAM searches, each on a fraction of the database. The result is that searches may be pipelined with a tiny increase in latency and the throughput equivalent to a single search. The total power may be reduced by at least an order of magnitude which is a great savings considering that power consumption is the "Achilles' Heel" of TCAM.

The present invention may allow greater flexibility and scalability of rules and may be easily parallelizable.

Applicants have realized that not all databases may be so easily divided. In particular, databases with multiple rules that differ only by "don't care" (parent-child relations) cannot easily be divided into different databases. In this situation, parents with many children get duplicated into as many databases as the children are in.

For example, there may be three rules: 1X0X1, 11001 and 10001. It will be appreciated that rule 1X0X1 may be a parent to both 11001 and 10001. Thus, the three rules divide into:
1X0X1 and 11001
1X0X1 and 10001

And the parent rule 1X0X1 is in both sets. This is not a problem if the action associated with the parent rule is the same in both cases. Otherwise, both copies of the parent rule must be kept and priority preserved, where a higher priority rule is one with the least don't care bits.

One solution for when a don't care is duplicated in a database division is to replace it with two values, one where the don't care is a 1 and one where the don't care is a 0.

For example, the original data may be:
(a) 10X0X, (b) 10101 and (c) 10001
In the divided database, (a) becomes 1010X and 1000X, as follows:
(a) 1010X, (b) 10101
(a) 1000X, (c) 10001

If a database to be divided contains only parents and children and all of the bits in all of the rules in the database differ only by 1-X or 0-X (and there are rules where bits differ by 1-0), then a D-Rule may be defined at a bit where not all rules have X as a value. For example, the rules associated with a D-rule of 01 XXX may be:
(a) 01001, (b) 01X01, (c) 010X1, (d) 01XXX
Bit 3 may be the dividing bit such that:
D-Rule: 011XX. Rules: (b) 01101, (d) 011XX
D-Rule: 010XXa. Rules: (a) 01001, (b) 01001, (c) 010X1, (d) 010XX The process may be repeated until all databases are below a minimum size.

In another situation, there may be a small number of rules, known as "Global Parents" (GPRs) which may be parents of many other rules in the database. GPRs will duplicate into all the databases that their children split into. This may significantly add to the size of the database. In accordance with a preferred embodiment of the present invention, the global parents may be removed from the database and may be put into their own search table. The database division may then be performed as described hereinabove on the remaining rules excluding the global parents.

In this embodiment, all keys may be searched in the split databases and, if the search fails (or in parallel), a search may be made in the Global Parents database. This may violate the requirement of unique key matches; however, instead of only one match there may now be only two matches, which may be handled in hardware, as described hereinbelow.

Figure 4A:
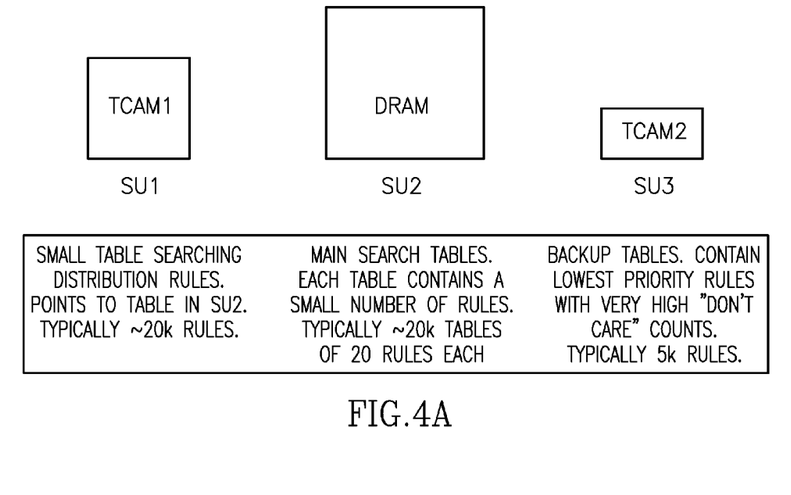
FIGS. 4A and 4B are schematic illustrations of two alternative implementations of the multi-stage search units of FIGS. 2A and 2B.
Figure 4B:
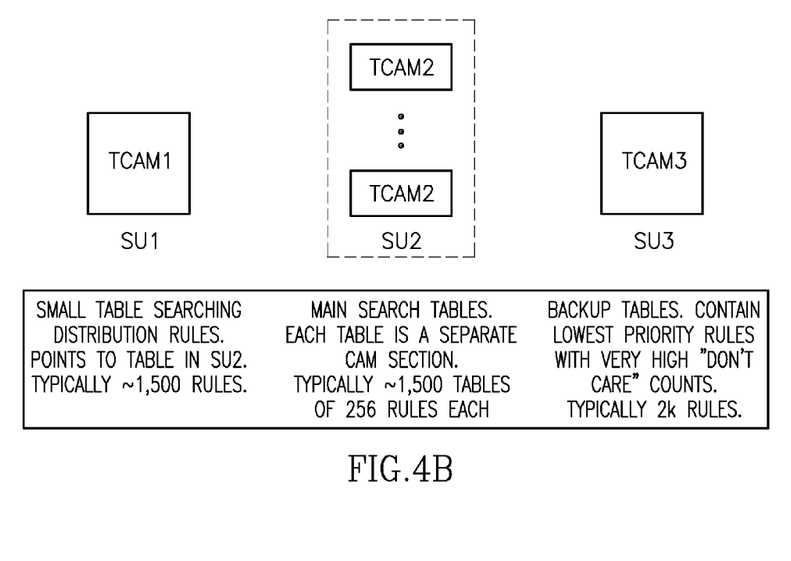

Reference is now made to FIGS. 4A and 4B which illustrates two alternative embodiments for searching with GPRs. In both embodiments there are 3 search units (SUs), SU1, SU2 and SU3. In both figures, SU1 and SU3 are TCAMs. In FIG. 4A, SU2 is a DRAM while in FIG. 4B it is a TCAM.

In FIG. 4A, SU1 is a TCAM which may be a small table storing about 20K (where K=1000) D-rules, all of which point to their associated locations in SU2, a DRAM. DRAM SU2 may store the main search tables, where each table may contain a small number of rules. Typically, there may be 20K tables of 20 rules or less. If the search through DRAM SU2 fails, a search may be made through SU3, a TCAM, which may store backup tables, of maybe 5K rules, of the Global Parents. These may be the lowest priority rules and may have many bits with Don't Care values.

In FIG. 4B, SU1 is a TCAM which may be a small table storing about 1.5K D-rules; all of which point to their associated locations in SU2, a TCAM. SU2 may store the main search tables, where each table may be a separate CAM section. Typically, there may be 1.5K tables of 256 rules or less. SU3, a TCAM may store backup tables, of maybe 2K rules, of the Global Parents.

It will be appreciated that the tables in SU2 are typically very small, 20 in the case of DRAM and 256 in the case of second stage TCAM.

Figure 5A:
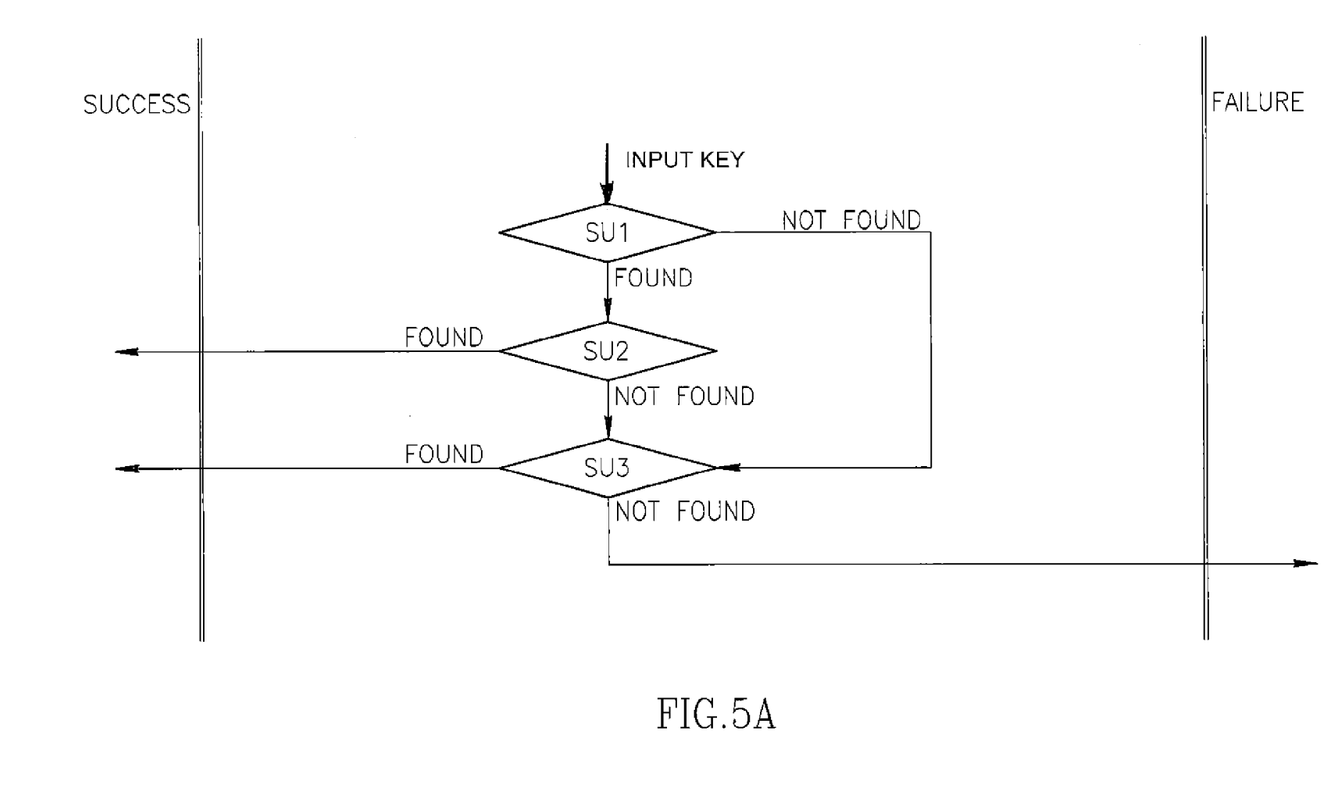
FIGS. 5A and 5B are alternative timing diagram illustrations for accessing the multi-stage units of FIGS. 4A and 4B.
Figure 5B:
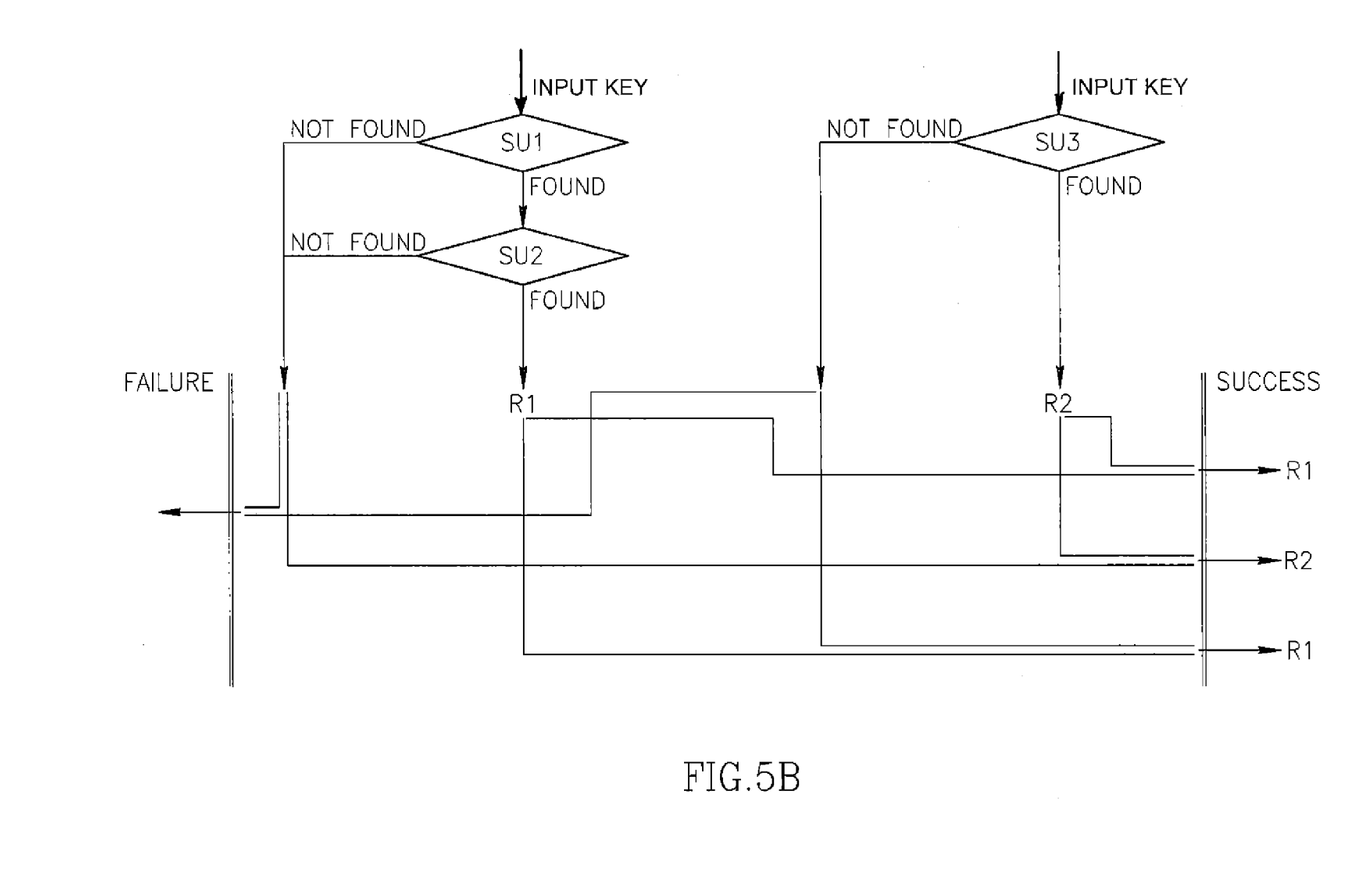

Reference is now made to FIGS. 5A and 5B which illustrate two alternative search flows. FIG. 5A shows pipelined searches and FIG. 5B shows parallel searches. In FIG. 5A, once the search through SU1 is complete, the result is passed to SU2. Simultaneous with the search in SU2, a new search can begin in SU1.

If the search through either SU1 or SU2 fails, a search may begin in SU3. Simultaneous with search in SU3, a new search may begin in SU1 and SU1's search may be continued in SU2.

All units may work on a different solution at the same time, thereby maintaining throughput although adding a slight increase in latency. Power may be conserved because SU3 is not working all the time.

In FIG. 5B the same key may be input to SU1 and SU3 at generally the same time. If the SU1/SU2 combination succeeds, the result from SU3 may be discarded. If SU1/SU2 fails, the result from SU3 is already available and may be used. This embodiment uses a little more power because SU3 is always active.

There are many ways to determine the GPRs. In one embodiment, they may be identified as the last P rules in the original database, or the P lowest priority rules in the database, given that P is the number of rows in SU3.

In an alternative embodiment, the following method may be performed:

1. Perform the complete database splitting algorithm.
2. Find the rule with the most duplication. This is a candidate global parent.
3. Find all rules that are parents or children of this rule, which have lower priority than the rule found in step 2. Remove these rules from the GPR search.
4. Repeat steps 2-3 recursively until there are no more rules left to search or until P GPRs have been identified.
5. If P is reached before step 4 is complete, rewind and do not remove rule.

If a database has GPRs that have higher priorities, the method may be changed as follows:

1. Each rule is stored with a priority index (which could simply be its position in the original database).
2. Always search through SU3.
3. If both SU1/SU2 and SU3 succeed, compare the priorities of the results and select accordingly.

Appendix A is pseudo-code for the present algorithm which, given a set of rules, describes how to divide the rules into multiple databases. Appendix B is an exemplary code for the algorithm of Appendix A.

Unless specifically stated otherwise, as apparent from the preceding discussions, it is appreciated that, throughout the specification, discussions utilizing terms such as "processing," "computing," "calculating," "determining," or the like, refer to the action and/or processes of a computer, computing system, or similar electronic computing device that manipulates and/or transforms data represented as physical, such as electronic, quantities within the computing system's registers and/or memories into other data similarly represented as physical quantities within the computing system's memories, registers or other such information storage, transmission or display devices.

Embodiments of the present invention may include apparatus for performing the operations herein. This apparatus may be specially constructed for the desired purposes, or it may comprise a general-purpose computer selectively activated or reconfigured by a computer program stored in the computer. Such a computer program may be stored in a computer readable storage medium, such as, but not limited to, any type of disk, including floppy disks, optical disks, magnetic-optical disks, read-only memories (ROMs), compact disc read-only memories (CD-ROMs), random access memories (RAMS), electrically programmable read-only memories (EPROMs), electrically erasable and programmable read only memories (EEPROMs), magnetic or optical cards, Flash memory, or any other type of media suitable for storing electronic instructions and capable of being coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein.

While certain features of the invention have been illustrated and described herein, many modifications, substitutions, changes, and equivalents will now occur to those of ordinary skill in the art. It is, therefore, to be understood that the claims appended after the attached appendices are intended to cover all such modifications and changes as fall within the true spirit of the invention.

What is claimed is:

1. A search unit comprising:
   a distributor TCAM (ternary content addressable memory) to store distributor rules and to match an input key to one of said distributor rules; and
   a DRAM (dynamic random access memory) search unit comprising a DRAM storage unit and an associated DRAM search logic unit, said DRAM storage unit having a large plurality of sections, each section pointed to by a different distributor rule and storing a small plurality of rules defined by its associated distributor rule, said DRAM search logic unit to receive said input key and to receive a section identifier (ID) from said distributor TCAM responsive to the input key matching said one of said distributor rules, and to search through said small plurality of rules in the section pointed to by said section ID and to select one of the small plurality of rules best matching said input key.

2. The search unit according to claim 1 wherein said DRAM storage unit comprises a multiplicity of banks and wherein said DRAM search logic unit can access one row from each bank of said DRAM storage unit generally at the same time.

3. The search unit according to claim 1 further comprising a global parents TCAM to store distributor rules each having a significant plurality of children rules.

4. A method to divide a database of TCAM (ternary content addressable memory) rules, the method comprising the steps of:
- transferring to a search logic unit a rule of said database having multiple don't care values;
- generating in said search logic unit two distributor rules based on said transferred rule by assigning to a bit of said transferred rule having a don't care value a 1 value in one of said two distributor rules and a 0 in the other of said two distributor rules;
- associating rules of said database which match each of said two distributor rules with the distributor rule they match thereby to create subset databases; and
- repeating said steps of transferring, generating, and associating on said database of TCAM rules and on said subset databases until the average number of rules in said subset databases is less than or equal to a predefined amount.

5. A method according to claim 4 further comprising placing each said two distributor rules into a TCAM and placing said subset databases in a DRAM (dynamic random access memory).

6. A method according to claim 4 further comprising placing said two distributor rules into a TCAM and placing each of said subset databases in a small TCAM.

7. The method according to claim 4 further comprising determining a set of global parents rules each having a significant plurality of children rules.

8. A method according to claim 7 further comprising placing said set of global parents rules into a global parents TCAM, separate from a TCAM for said distributor rules and separate from a storage unit for said subset databases.

* * * * *